(12) United States Patent
Stahl-Offergeld et al.

(10) Patent No.: US 9,116,192 B2
(45) Date of Patent: Aug. 25, 2015

(54) CALIBRATABLE MAGNETIC FIELD SENSOR AND METHOD OF PRODUCING SAME

(75) Inventors: Markus Stahl-Offergeld, Erlangen (DE); Roland Ernst, Erlangen (DE); Hans-Peter Hohe, Heiligenstadt (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 592 days.

(21) Appl. No.: 13/399,057

(22) Filed: Feb. 17, 2012

(65) Prior Publication Data

US 2012/0212216 A1   Aug. 23, 2012

(30) Foreign Application Priority Data

Feb. 18, 2011   (DE) .......................... 10 2011 004 391

(51) Int. Cl.
*G01R 33/07*   (2006.01)
*G01R 33/00*   (2006.01)

(52) U.S. Cl.
CPC ........ *G01R 33/0035* (2013.01); *G01R 33/0017* (2013.01); *G01R 33/077* (2013.01)

(58) Field of Classification Search
None
See application file for complete search history.

(56) References Cited

U.S. PATENT DOCUMENTS

2011/0031960 A1   2/2011   Hohe et al.
2012/0016614 A1*  1/2012   Hohe et al. ...................... 702/85

FOREIGN PATENT DOCUMENTS

DE   10 2006 037 226 A1   2/2008
DE   10 2007 041 230 B3   4/2009

OTHER PUBLICATIONS

Stahl-Offergeld et al., "Integrated Sensitivity Adjustment for 3D Hall Sensors," Sensor Letters, American Scientific Publishers, vol. 7, No. 3, Jun. 2009, pp. 313-316.

* cited by examiner

*Primary Examiner* — Melissa Koval
*Assistant Examiner* — Courtney McDonnough
(74) *Attorney, Agent, or Firm* — Keating & Bennett, LLP

(57) ABSTRACT

Magnetic field sensor having a vertical Hall sensor element arranged in a semiconductor substrate, and an exciting conductor arrangement having at least one exciting conductor, the exciting conductor being arranged within an exciting conductor plane which is spaced apart, in parallel to the substrate surface, from the vertical Hall sensor element at a vertical distance $h_1$ having a tolerance range $\Delta h_1$ which is due to the manufacturing process, and which exciting conductor further has a lateral distance $d_1$ as an offset from a center position which is located, in relation to the substrate surface, perpendicularly to the vertical Hall sensor element, and the lateral distance $d_1$ being dimensioned such that a vertical calibration component $B_{1x}$ of a magnetic flux density $B_1$ created by the exciting conductor arrangement in the vertical Hall sensor element changes by less than 5% within the tolerance range $\Delta h_1$ for the vertical distance $h_1$.

10 Claims, 6 Drawing Sheets

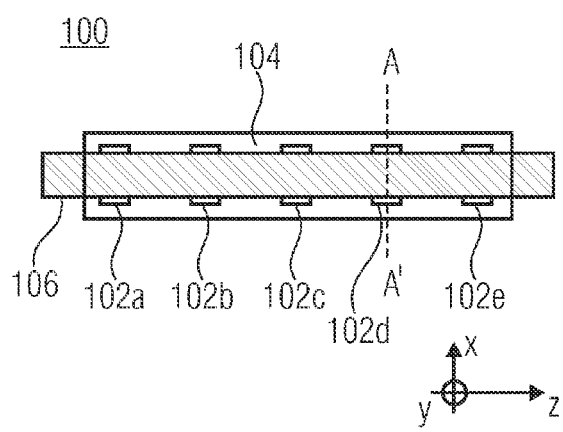
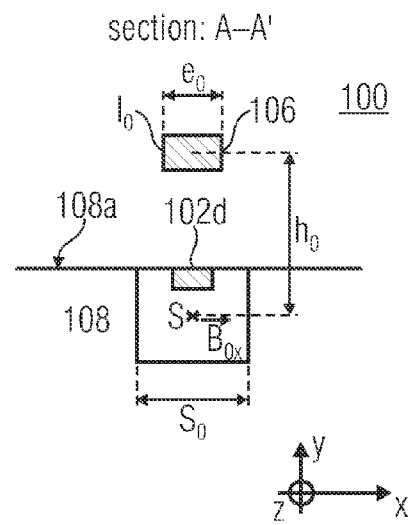
FIGURE 6A  FIGURE 6B
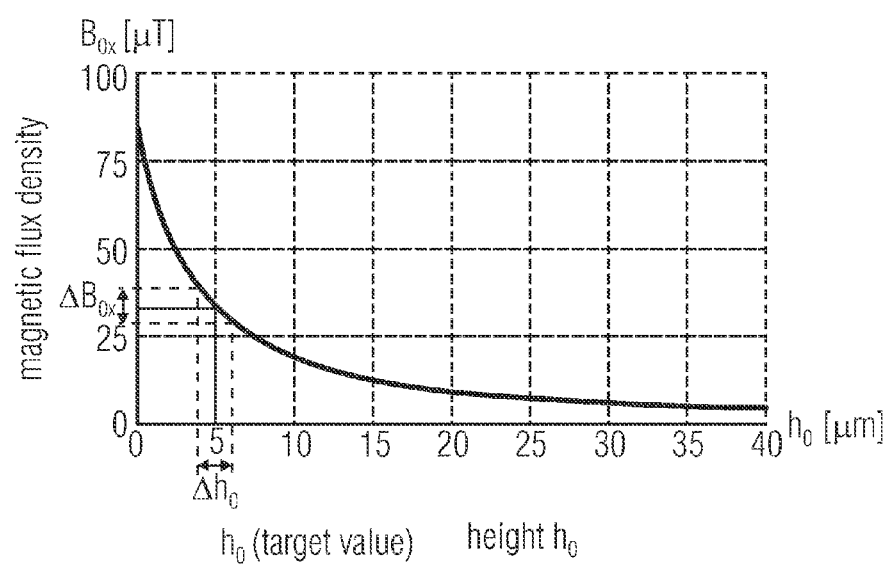
FIGURE 7

CALIBRATABLE MAGNETIC FIELD SENSOR AND METHOD OF PRODUCING SAME

CROSS-REFERENCE TO RELATED APPLICATIONS

This application claims priority from German Patent Application No. 102011004391.8-35, which was filed on Feb. 18, 2011 and is incorporated herein in its entirety by reference.

The present invention relates to a calibratable magnetic field sensor comprising a vertical Hall sensor element, and to a method of producing same.

BACKGROUND OF THE INVENTION

To determine the sensitivity of a magnetic field sensor, a magnetic field having a magnetic flux density, which should be known, if possible, is created at the location of the sensor by impressing a defined current into a coil or an exciting (excitation) conductor. The resulting change in the output signal of the magnetic field sensor upon application of a calibrating magnetic field may then be used to infer the sensitivity of the sensor. Thus, in a Hall sensor element, a change in the Hall voltage, which is caused by a change in the magnetic flux density in the sensor element, may be used to infer the actual sensitivity of the Hall sensor element.

With exciting (excitation) coils or exciting conductor patterns, the problem may arise that during manufacturing of the magnetic field sensor in a semiconductor substrate, the individual layer structures are subjected to process variations as typically occur in the manufacturing of semiconductor devices. In a semiconductor device, said process variations are generally considerably larger in the vertical direction, i.e. in a direction perpendicular to the substrate surface, than in a lateral direction, i.e. in a plane parallel to the semiconductor substrate surface. Accordingly, an actual value of a distance between the active area of the Hall sensor element and the exciting conductor pattern may deviate from an ideal distance value aimed at during manufacturing. Since in the calibration of the magnetic field sensor by means of a magnetic field created by a defined calibration current, the position and/or the effective distance of the exciting line from the active area of the Hall sensor element is accounted for, any process tolerances not taken into account may lead to inaccurate calibration of the magnetic field sensor.

FIGS. 6a-b show a schematic diagram in the form of a top view and a sectional view of a vertical Hall sensor element 100 in a semiconductor substrate 108. Vertical is supposed to mean a plane perpendicular to the semiconductor substrate and/or chip surface 108a, i.e. vertical to the x-z plane in FIGS. 6a-b. The vertical Hall sensor element 100 shown in FIGS. 6a-b comprises five contact areas 102a-e along the main surface of the active semiconductor area 104. Vertical Hall sensors, which may sense a magnetic field component $B_{0x}$ in the active area parallel to the substrate surface (in the x direction), may be provided with a calibration flux density $\vec{B}_0$ in a targeted manner for calibration by means of an exciting conductor 106 through which a calibration current $I_0$ flows. As is schematically shown in FIG. 6a, the exciting conductor 106 is arranged at a height $h_0$ directly above, or perpendicularly above, the Hall sensor element 100. As is further depicted in FIGS. 6a-b, the active area 104 of the Hall sensor element 100 has a width $s_0$, for example, while the exciting conductor 106 has a width $e_0$.

In this manner, the magnetic flux density $B_{0x}$ created at the location of the sensor by the exciting conductor 106 may be approximately specified on the basis of the distance $h_0$ between the Hall sensor element 100 and the exciting conductor 106, the sensor width $s_0$, the exciting conductor width $e_0$ and the current $I_0$ flowing through the exciting conductor 106.

In a vertical Hall sensor element, the above-mentioned process tolerances may have a particularly strong impact since the distance $h_0$ between the active area 104 of the Hall sensor element 100 and the exciting conductor 106 may frequently vary within a range of ±40% of the actual target distance $h_0$ due to process variations or process tolerances. As a result, the sensitivity of vertical Hall sensor elements can be determined with a relatively low level of accuracy only.

FIG. 7 shows, e.g., the dependence of the magnetic flux density $B_{0x}$ (e.g. in µT) on the height $h_0$ (in µm) of the exciting conductor 106 above the active area 104 of the Hall sensor element 100. The magnetic flux density $B_{0x}$ decreases in proportion to $1/h_0$ over the distance $h_0$. If one assumes, for example, a distance $h_0$ of 5 µm, within a tolerance range of, e.g., only about ±20% (±1 µm) of the distance $h_0$, marked differences from the expected values for the magnetic flux density $B_{0x}$ will result in the active area 104 of the Hall sensor element 100. Thus, already relatively small changes $\Delta h_0$ in the distance $h_0$ result in relatively marked changes in the magnetic flux density $B_{0x}$ created in the active area 104 of the Hall sensor element 100.

FIG. 8 shows the change in the magnetic flux density $\vec{B}_0$ at the location of the sensor, i.e. in the active area of the Hall sensor element 100, in dependence on the process tolerances $\Delta h_0$ with regard to the distance $h_0$. If one assumes, again, a target distance $h_0$ of 5 µm, the magnetic flux density $B_{0x}$ which is expected for a predefined calibration current intensity $I_0$ will amount to 33 µT, for example. However, if the distance $h_0$ varies by about $\Delta h_0 = \pm 20\%$ (e.g. ±1 µm) due to the process tolerances, for example, a distance $h_0$ of 4 mm will result in a magnetic flux density of about 38 µT, whereas a distance $h_0$ of 6 µm will result in a magnetic flux density of about 28 µT. Thus, the resulting magnetic flux density $B_{0x}$ will vary already by more than 25% if the distance $h_0$ is exposed only to a tolerance range of $\Delta h_0 = \pm 20\%$ due to process variations. Actually, process variations of ±40% may frequently occur for layer thicknesses in semiconductor manufacturing processes. As a result, precise determination of the sensitivity of the Hall sensor element 100 will at least be very imprecise if the calibration is performed only with an assumed exciting conductor distance $h_0$, which in reality is often not fully correct, or imprecise, due to the process tolerances $\Delta h_0$, rather than being performed on the basis of a knowledge of the actual distance value $h_0 \pm \Delta h_0$.

SUMMARY

According to an embodiment, a magnetic field sensor may have: a vertical Hall sensor element arranged in a semiconductor substrate; and an exciting conductor arrangement including at least one exciting conductor; said exciting conductor being arranged within an exciting conductor plane which is spaced apart, in parallel to the substrate surface, from the vertical Hall sensor element at a vertical distance $h_1$ having a tolerance range $\Delta h_1$ which is due to the manufacturing process, and further has a lateral distance $d_1$ as an offset from a center position which is located, in relation to the substrate surface, perpendicularly to the vertical Hall sensor element, and said lateral distance $d_1$ being dimensioned such that a vertical calibration component $B_{1x}$ of a magnetic flux density $B_1$ created by the exciting conductor arrangement in the vertical Hall sensor element changes by less than 5% within the tolerance range $\Delta h_1$ for the vertical distance $h_1$.

According to another embodiment, a method of producing a magnetic field sensor may have the steps of: producing or providing a vertical Hall sensor element arranged in a semiconductor substrate; and arranging an exciting conductor arrangement including at least one exciting conductor, the exciting conductor being arranged within an exciting conductor plane which is spaced apart, in parallel to the substrate surface, from the vertical Hall sensor element at a vertical distance $h_1$ having a tolerance range $\Delta h_1$ which is due to the manufacturing process, and which exciting conductor further has a lateral distance $d_1$ as an offset from a center position which is located, in relation to the substrate surface, perpendicularly to the vertical Hall sensor element, and the lateral distance $d_1$ being dimensioned such that a vertical calibration component $B_{1x}$ of a magnetic flux density $B_1$ created by the exciting conductor arrangement in the vertical Hall sensor element changes by less than 5% within the tolerance range $\Delta h_1$ for the vertical distance $h_1$.

Advantageous implementations of the invention are indicated in the subclaims.

It is the core idea of the present invention that an exciting conductor arrangement comprising an exciting conductor or a plurality of exciting conductors be arranged in a magnetic field sensor, or a calibratable magnetic field sensor arrangement so as to be laterally offset from a central position located perpendicularly above or below the vertical Hall sensor element, said offset or lateral distance from the central position being set, in dependence on the vertical distance, such that process variations due to manufacturing will have a clearly reduced influence on a calibration process without the actually occurring process variations having to be known in terms of quantity. Due to the lateral offset of the exciting conductor from the central position, the component $B_{1x}$, which may be detected by the Hall sensor element, in the x direction of the magnetic flux density within the active semiconductor area of the Hall sensor element will have a curve, in dependence on the vertical distance and/or the height between the exciting conductor and the active area of the Hall sensor element, which has a local maximum and thus exhibits, in the area around the local maximum, a very small dependence of the magnetic flux density on process-induced variations in the distance.

The vertical distance or height between the exciting conductor and the active area of the Hall sensor element is considered to be the distance between a plane defined by the center of gravity or the center-of-gravity line of the exciting conductor and a plane defined by the center of gravity or the center-of-gravity line of the active area of the Hall sensor element, both planes being parallel to each other and to the semiconductor substrate surface.

Since in semiconductor manufacturing processes, lateral dimensions are subjected to considerably smaller process variations, the lateral distance, or lateral offset, of the exciting conductor in relation to the center position may now be precisely dimensioned such that the resulting calibration component of a magnetic flux density created by the exciting conductor arrangement in the active area of the vertical Hall sensor element changes by less than 5% or even 1% within the tolerance range for the vertical distance. In this context it is assumed that, e.g., a predefined calibration current $I_1$ is injected into the exciting conductor.

The vertical calibration component, created in the active area of the vertical Hall sensor element, of the magnetic flux density thus is essentially independent of the process tolerances which occur in the manufacturing of a vertical Hall sensor element and are frequently inevitable. The inventive calibratable magnetic field sensor may now be calibrated in a very precise manner, even without knowledge of the change (s), caused by process tolerances, in vertical dimensions of the resulting layer structure.

BRIEF DESCRIPTION OF THE DRAWINGS

Embodiments of the present invention will be detailed subsequently referring to the appended drawings, in which:

FIGS. 6a-b show a schematic diagram in a top view and a sectional view of a magnetic field sensor in accordance with conventional technology;

FIG. 7 shows a schematic curve of the magnetic flux density in a magnetic field sensor in accordance with conventional technology.

DETAILED DESCRIPTION OF THE INVENTION

Figure 1A:
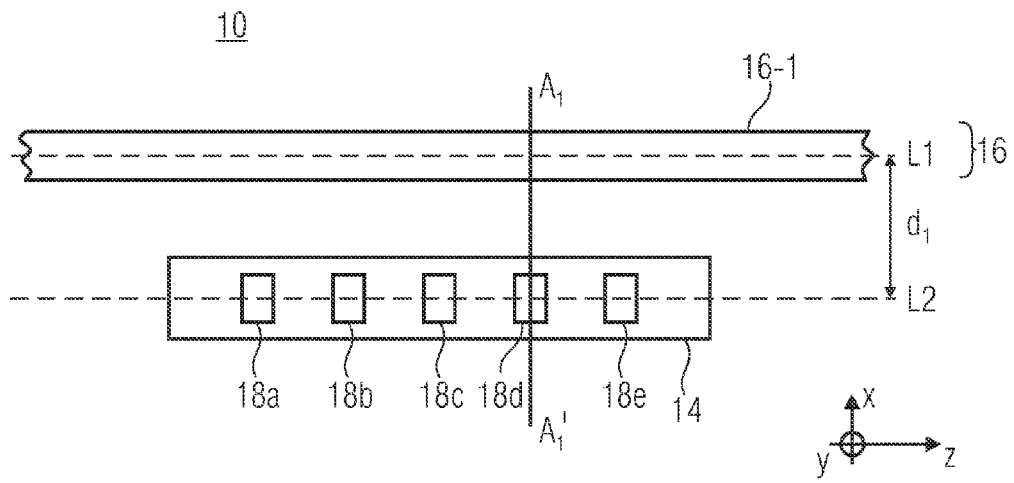
FIGS. 1a-b show schematic diagrams in a top view and a sectional view of a calibratable magnetic field sensor in accordance with an embodiment of the present invention.

Before the present invention will be explained in more detail with reference to the drawings, it shall be noted that elements that are identical or identical in terms of function or effect are provided with identical reference numerals in the figures, so that the descriptions of said elements represented in different embodiments are mutually exchangeable and/or mutually applicable.

A first embodiment of a calibratable magnetic field sensor 10 in accordance with the present invention will be described by means of FIGS. 1a-b.

Figure 1B:
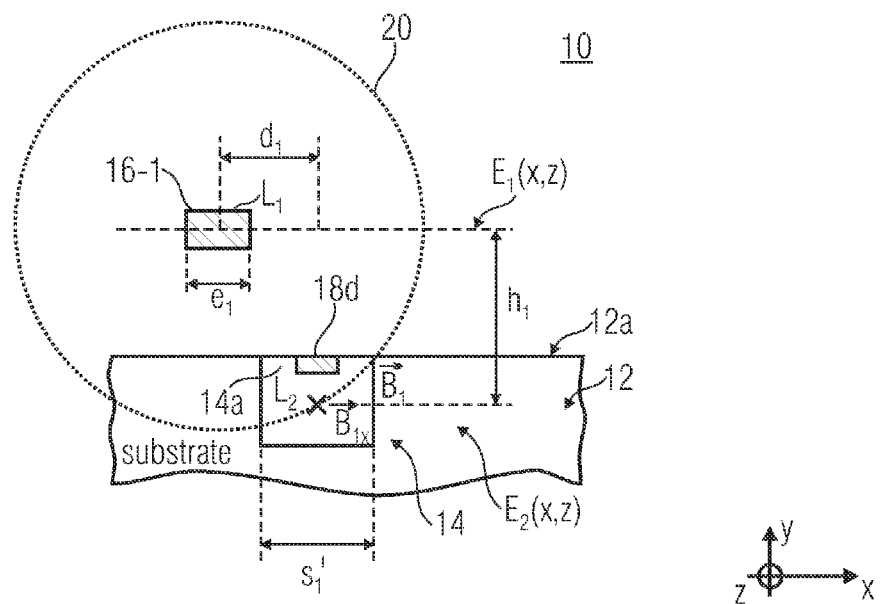

FIGS. 1a-b show, in a schematic sectional representation, the calibratable magnetic field sensor 10 comprising the vertical Hall sensor element 14 arranged within a semiconductor substrate 12, and the exciting conductor arrangement 16 spaced apart from the Hall sensor element 14. In the embodiment depicted in FIGS. 1a-b, the exciting conductor arrangement 16 comprises an exciting conductor 16-1. As is further depicted in FIGS. 1a-b, the active area 14a of the Hall sensor element 14, for example, has a width s, while the exciting conductor 16-1 has a width $e_1$. In FIG. 1a, the vertical Hall sensor element 14 has, e.g., five contact areas 18a-e at the main surface 12a of the semiconductor substrate 12 along the active semiconductor area 14. However, the vertical Hall sensor element 14 may also have a different number and arrangement of contact areas.

As is depicted in FIG. 1b along the sectional line $A_1A_1'$ of FIG. 1a, in the inventive calibratable magnetic field sensor 10 the exciting conductor 16-1 is parallel—within an exciting conductor plane $E_1$ (parallel to the x-z plane), which runs, e.g., through a geometrical center of gravity or center-of-gravity line $L_1$ of the exciting conductor 16-1—to the substrate surface 12a at a vertical distance or a height $h_1$ from/of a plane $E_2$ (parallel to the x-z plane) which runs through a center of gravity or center-of-gravity line $L_2$ of the active area 14a of the Hall sensor element 14. In a semiconductor manufacturing process, for example, the vertical distance $h_1$ is subjected to process tolerances and/or process variations $\Delta h_1$. The exciting conductor 16-1 is now also arranged at a lateral distance $d_1$ as an offset from a central position located, in relation to the substrate surface 12a, perpendicularly above (or optionally also below) the vertical Hall sensor element 14.

Thus, due to the process variations, changes may occur in the vertical distance $h_1$ between the plane $E_1$ running through the center of gravity or the center-of-gravity line $L_1$ of the exciting conductor 16-1 and the plane $E_2$ running through the center of gravity or the center-of-gravity line $L_2$ of the active area 14a of the Hall sensor element 14, both planes $E_1$, $E_2$ being parallel to each other and to the semiconductor substrate surface 12a.

For example, the semiconductor substrate surface 12a may have several different process sheets formed thereon, such as a metal-1 process sheet for contact terminals 18a-d connecting to the vertical Hall sensor element 14 as well as a metal-2 process sheet wherein, e.g., the exciting conductor arrangement 16 comprising the exciting conductor 16-1 may be formed. Naturally, an additional one or several additional metal process sheets may be provided so as to form the contact terminals 18a-d connecting to the vertical Hall sensor element 14 as well as the exciting conductor arrangement 16 comprising the exciting conductor 16-1. The exciting conductor 16-1 may be configured as a conductor trace of a semiconductor device. Insulating layers, e.g. made of an oxide or nitride material, which are not explicitly shown in FIGS. 1a-b may be arranged between individual metallization layers, e.g. metal-1 and metal-2, etc., or on the semiconductor substrate surface 12a.

If a current $I_1$ (having a current intensity of, e.g., 1 mA) is impressed into the exciting conductor 16-1 and flows, e.g., in a direction out of the drawing plane of FIG. 1b (z direction), the current flow will cause a magnetic flux density $\vec{B}_1$ at the location of the sensor, i.e. at the center of gravity of the active area 14a of the vertical Hall sensor element 14. In this embodiment, the magnetic field lines 20 are arranged radially about the exciting conductor 16-1 in the x-y plane, it being possible for the Hall sensor element to detect a magnetic field component $B_{1x}$ in the x direction. The magnetic flux density $\vec{B}_1$ is a vector which may be represented, for example, in a Cartesian coordinate system, with magnetic field components $B_{1x}$, $B_{1y}$ and $B_{1z}$ corresponding to linearly independent position vectors x, y, z.

The arrangement, shown in FIGS. 1a-b, of the exciting conductor 16-1 with regard to the active area 14a of the Hall sensor element 14 with the lateral offset $d_1$ of the exciting conductor 16-1 from the center position yields (approximately) a magnetic flux density $B_{1x}$ in the direction of sensitivity (in the x direction of FIGS. 1a-b) of the vertical Hall sensor element 14 in accordance with the following equation:

$$B_{1x} = \frac{\int_{-e_1/2}^{+e_1/2} \int_{-s/2}^{+s/2} \frac{\mu}{2\pi} \cdot \frac{h_1}{(x1-x2+d_1)^2 + h_1^2} \cdot I_1 dx1 dx2}{s \cdot e_1}; \quad (1)$$

$d_1$ represents the lateral offset of the exciting conductor 16-1 with regard to the center position, while the active area 14a of the vertical Hall sensor element 14 has an effective width s, and the exciting conductor 16 has a width $e_1$ (in the plane $E_1$).

Figure 2:
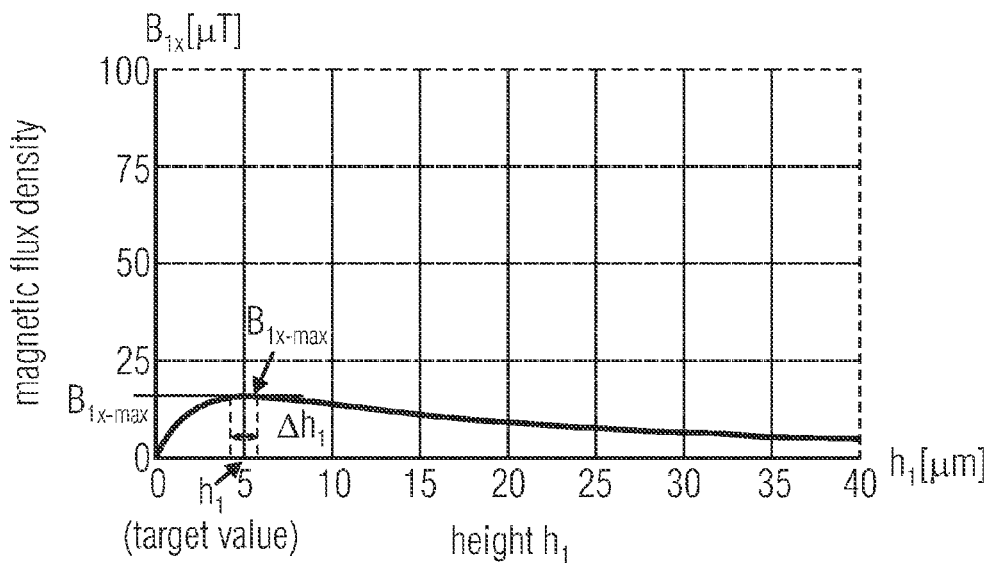
FIG. 2 shows a schematic curve of the magnetic flux density on the basis of the laterally offset arrangement of the exciting conductor and in dependence on the vertical distance in accordance with an embodiment of the present invention.

The lateral offset $d_1$, provided in accordance with the invention, of the exciting conductor 16-1 in the exciting conductor plane $E_1$ in relation to the center position results in a curve of the magnetic flux density $B_{1x}$ in dependence on the vertical distance $h_1$ and at a current intensity $I_1$ of, e.g., 1 mA, as is depicted by means of FIG. 2. FIG. 2 reveals that from a value for the vertical distance of $h_1=0$ [µm] and given a current intensity $I_1$ of, e.g., 1 mA, the magnetic flux density $B_{1x}$ will increase from a value close to 0 [µT]. A vertical distance $h_1=0$ means that the exciting conductor 16 and the active area of the Hall sensor element 14 would be parallel to each other within a plane. In this case, the resulting component $B_{1y}$ of the magnetic flux density $\vec{B}_1$ would penetrate the vertical Hall sensor element 14 in a manner perpendicular to the direction of sensitivity of the latter, and would essentially not create any output signal. As the value of the vertical distance $h_1$ increases, the resulting component $B_{1x}$ of the magnetic flux density $\vec{B}_1$, which can be sensed by the vertical Hall sensor element 14, increases up to a maximum value $\vec{B}_{1xmax}$ and will then drop at a relatively low rate following a plateau area, and/or following the local maximum $\vec{B}_{1xmax}$ as the values of the vertical distance $h_1$ increase.

Figure 3:
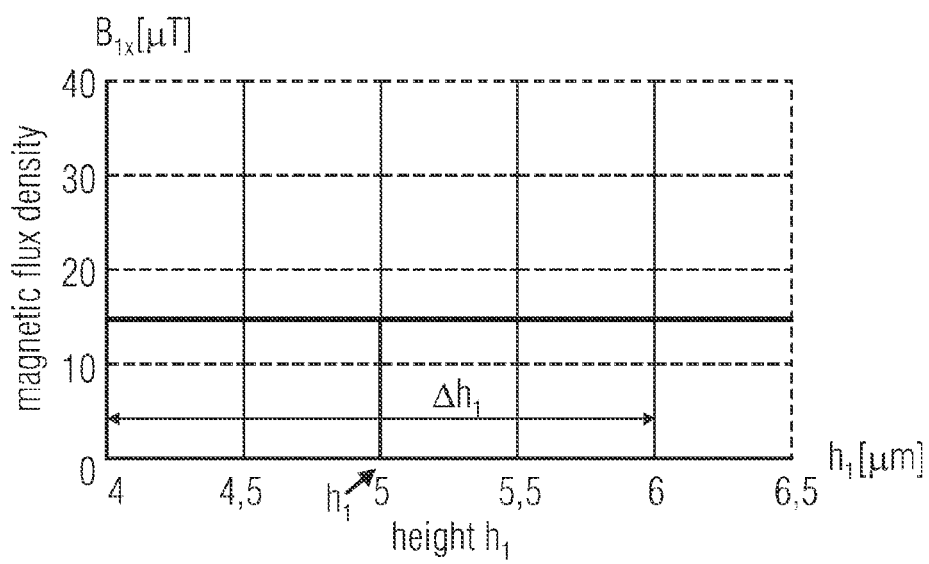
FIG. 3 shows a schematic curve of the magnetic flux density within a tolerance range for the vertical distance in accordance with an embodiment of the present invention.

The above values of the selected current intensity $I_1$ and the vertical distance $h_1$ are to be regarded as being exemplary only so as to obtain the curve, qualitatively illustrated in FIGS. 2 and 3, of the magnetic flux density $B_{1x}(h_1)$ in dependence of the vertical distance $h_1$.

In accordance with the invention, on the basis of the knowledge of the curve of the resulting magnet field component $B_{1x}$ of the flux density $\vec{B}_1$ created in the active area of the Hall sensor element, the lateral distance $d_1$ of the exciting conductor 16 from the center position is dimensioned, or set, such that, given a predefined vertical distance $h_1$ (e.g. $h_1=5$ µm), which is subjected to process tolerances, for example, and may vary within a tolerance range of $\Delta h_1(\pm 1$ µm), the curve of the component $B_{1x}$ of the magnetic flux density $\vec{B}_1$ will have, within the tolerance range to be expected for the vertical distance $h_1 \pm \Delta h_1$, as high a curve as possible, but also as linear a curve as possible across said tolerance range. In accordance with the invention, this is achieved in that the value of the lateral distance $d_1$ is selected, in dependence on the vertical (target) distance $h_0$, such that the curve of the component $B_{1x}$ of the magnetic flux density in the Hall sensor element 14 will have the (local) maximum value with as linear a range as possible for the value of the vertical distance $h_1$ and its tolerance range $h_1 \pm \Delta h_1$, i.e. will be located in a range of the local maximum $B_{1x-max}$ of FIG. 2.

As is shown in FIG. 3, which shows a section enlargement of the curve of the component $B_{1x}$ in the range of the local maximum $B_{1x-max}$, the component $B_{1x}$, created by the exciting conductor 16-1 placed in an offset manner, of the magnetic flux density $\vec{B}_1$ varies only by about ±1% across the range for process tolerances $h_1 \pm \Delta h_1$ for the vertical distance $h_1$. For example, if it is assumed that the vertical (target) distance $h_1=5$ µm and that process tolerances of ±20% may occur, the actual vertical distance $h_1$ may have values within the range of $h_1=4$ to 6 µm. However, said process tolerances have only an extremely small effect in a sensitivity measurement and/or a calibration process of the vertical Hall sensor element 14, as becomes clear from the almost linear curve of the magnetic field component $B_{1x}$ over the vertical distance $h_1$ of FIG. 3.

Since the maximum value $B_{1x\text{-}max}$ of the curve of the component $B_{1x}$ of the magnetic flux density $\vec{B}_1$ in the active area 14a of the Hall sensor element 14 depends on the lateral offset $d_1$ of the exciting conductor 16-1, the lateral distance $d_1$ may be dimensioned, in a targeted manner, such that the influence of process tolerances on the sensitivity measurement and/or the calibration process of the Hall sensor element 14 is clearly reduced. In accordance with the invention, for example, the lateral distance $d_1$ may be set, in a targeted manner, such that a calibration component $B_{1x}$ will change by less than 5% or 1% within the tolerance range $\Delta h_1$ for the vertical distance $h_1$ in the event of a predefined current flow and/or calibration current $I_1$ and a magnetic flux density $\vec{B}_1$ created accordingly in the vertical Hall sensor element 14, and/or its x component $B_{1x}$.

Figure 4A:
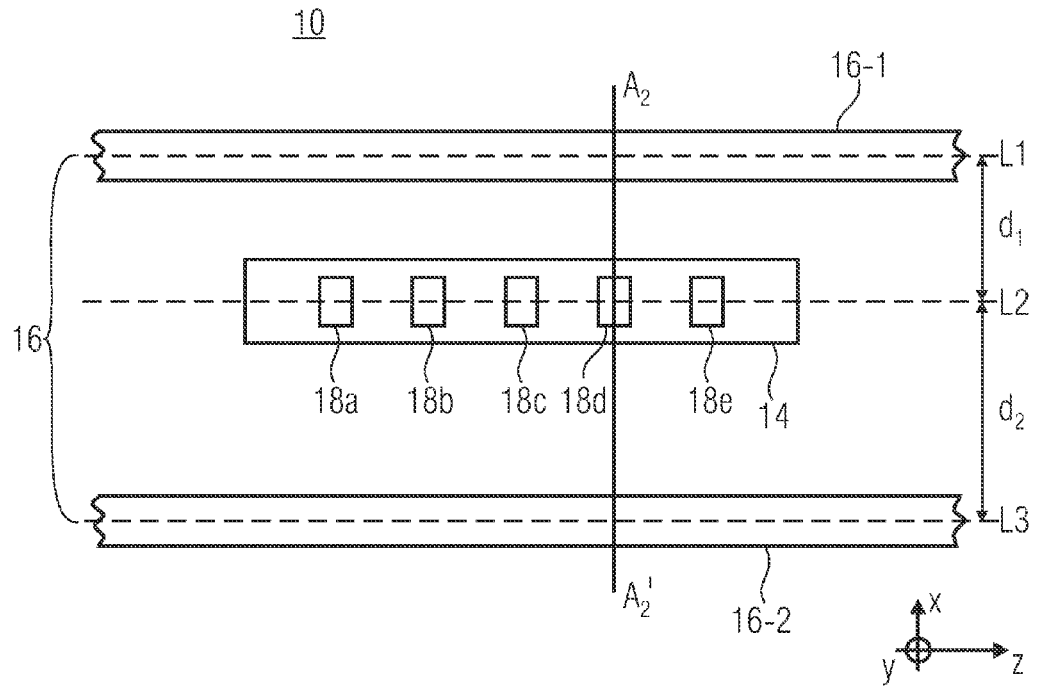
FIGS. 4a-b show schematic diagrams in a top view and a sectional view of a calibratable magnetic field sensor in accordance with a further embodiment of the present invention.
Figure 4B:
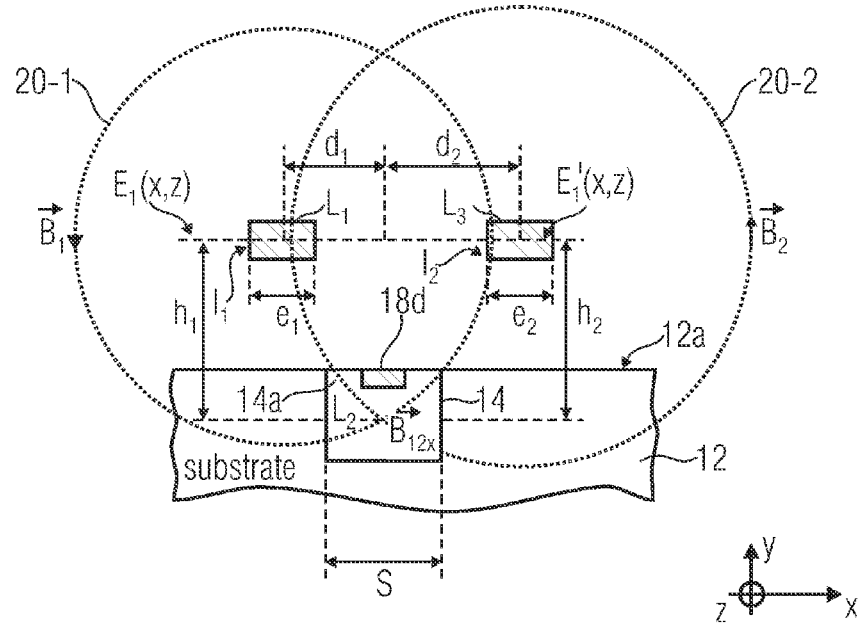

A further embodiment of the inventive calibratable magnet field sensor 10 will be described below with reference to FIGS. 4a-b. As is shown in FIGS. 4a-b, the exciting conductor arrangement 16 comprises a further, second exciting conductor 16-2 in addition to the first exciting conductor 16-1. The second exciting conductor 16-2 is also arranged within an exciting conductor plane $E'_1$, which is spaced apart, in parallel to the substrate surface 12a, from the vertical Hall sensor element 14 by a vertical distance $h_2$, said substrate surface 12a being exposed to a tolerance range $\Delta h_2$, for example, due to process variations. Moreover, the second exciting conductor 22 has a lateral distance $d_2$ as an offset from the center position, which is located—in relation to the substrate surface 12a—perpendicularly above the vertical Hall sensor element 14.

As is schematically depicted in FIG. 4b, the sensor element 14 is formed in the semiconductor substrate 12, several process sheets being provided wherein the first and second exciting conductors 16-1, 16-2 are formed, e.g. one metal-1 process sheet (not shown in FIG. 4b) for potential contact terminals connecting to the vertical Hall sensor element 14, as well as a metal-2 process sheet. Of course, one or more further metal process sheets may be provided, for example, to form the contact terminals 18a-d connecting to the vertical Hall sensor element 14, and to form the exciting conductor arrangement 16 having the exciting conductors 16-1, 16-2, etc. The first and second exciting conductors 16-1, 16-2 may be arranged as integrated conductor traces above the semiconductor substrate 12, it being possible for insulating layers (not shown in FIG. 4) to be arranged between the individual metallization layers metal-1 and metal-2, etc., and/or the semiconductor substrate surface 12a.

As is further depicted in FIGS. 4a-b, for example the active area 14a of the Hall sensor element 14 has a width s, whereas the exciting conductor 16-1 has a width $e_1$, and the exciting conductor 16-2 has a width $e_2$. In FIG. 4a, the vertical Hall sensor element 14 again has, e.g., five contact areas 18a-e at the main surface 12a of the semiconductor substrate 12 along the active semiconductor area 14. However, the vertical Hall sensor element 14 may also have a different number and arrangement of contact areas.

As is depicted in FIG. 4b along the intersection line $A_2A_2'$ of FIG. 4a, in the inventive calibratable magnetic field sensor 10, the first exciting conductor 16-1 within an exciting conductor plane $E_1$ (parallel to the x-z plane) running, for example, through a geometric center of gravity or center-of-gravity line $L_1$ of the exciting conductor 16-1, and the second exciting conductor 16-2 within an exciting conductor plane $E_1'$ (also parallel to the x-z plane) running, for example, through a geometric center of gravity or center-of-gravity line $L_3$ of the exciting conductor 16-2 are parallel to the substrate surface 12a at a vertical distance or a height $h_1$ and $h_2$, respectively, from a plane $E_2$ (parallel to the x-z plane) running through a center of gravity or center-of-gravity line $L_2$ of the active area 14a of the Hall sensor element 14. The vertical distances $h_1$ and $h_2$, for example, are subjected to process tolerances or process variations $\Delta h_1$ and $\Delta h_2$, respectively, in a semiconductor manufacturing process. Additionally, the exciting conductor 16-1 is arranged at a lateral distance $d_1$ as an offset from a center position located, in relation to the substrate surface 12a, perpendicularly above (or optionally below) the vertical Hall sensor element 14.

As is depicted in FIGS. 4a-b, the first and second exciting conductors 16-1, 16-2 are arranged within the same exciting conductor plane $E_1=E'_1$, so that $h_1=h_2$ holds for the vertical distance. This applies, for example, when both exciting conductors 16-1, 16-2 of the exciting conductor arrangement 16 are produced, in the manufacturing process, in the same metal process sheet and are thus also subjected to the same process tolerances with regard to the vertical distances $h_1$ and $h_2$. It is only optionally that the vertical distance $h_1$ for the first exciting conductor 16-1 and the vertical distance $h_2$ for the second exciting conductor 16-2 may be selected to be different.

If a first current $I_1$ is impressed into the first exciting conductor 16-1, and a second current $I_2$ is impressed (e.g. in the same direction) into the second exciting conductor 16-2, the currents $I_1$ and $I_2$, respectively, flowing within the respective exciting conductors 16-1 and 16-2 cause magnetic flux densities $\vec{B}_1$ and $\vec{B}_2$ in the active area 14a of the Hall sensor element 14, which flux densities superimpose to form a resulting magnetic flux density $\vec{B}_{12}$ at the location of the sensor. In this embodiment, the magnetic field lines 20-1, 20-2 are radially arranged around the respective exciting conductor 16-1, 16-2 within the x-y plane, it being possible to detect a resulting magnetic field component $B_{12x}$ in the x direction in the vertical Hall sensor element 14.

If, for a calibratable magnetic field sensor, the first and second exciting conductors 16-1, 16-2 are placed to be offset from a center position at different offsets $d_1$ and $d_2$, respectively, within the exciting conductor plane $E_1$ (if, e.g., $h_1=h_2$), the respective maxima for the components $B_{1x}$ and $B_{2x}$ of the magnetic flux density $B_{12x}$ generated by the first and second exciting conductors 16-1, 16-2 will be, in the active area 14a of the Hall sensor element 14, at different locations in relation to the curve of the component $B_{12x}$ of the magnetic flux density, represented over the vertical distances $h_1$ and $h_2$. By means of a targeted superimposition of the magnetic fields, which are created by predefined calibration currents $I_1$, $I_2$, respectively, in the first and second exciting conductors 16-1, 16-2, respectively, the influence of process tolerances on the vertical distances $h_1$, $h_2$ of the exciting conductor arrangement 16 may be reduced even further from the active area 14a of the vertical Hall sensor element 14 since by means of the targeted setting of the lateral offset in the form of the lateral distances $d_1$ and $d_2$ for the first and second exciting conductors 16-1, 16-2, further linearization may be achieved with regard to the resulting component $B_{12x}$ of the combination of the magnetic flux densities $\vec{B}_1$ and $\vec{B}_2$ in the active area 14a of the Hall sensor element 14.

The component $B_{12x}$, created by the first and second exciting conductors 16-1, 16-2, of the resulting magnetic flux density $\vec{B}_{12}$ may be approximately represented by the following equation:

$$B_{12x} = \frac{\int_{-e_1/2}^{+e_1/2} \int_{-s/2}^{+s/2} \frac{\mu}{2\pi} \cdot \frac{h_1}{(x1-x2+d_1)^2 + h_1^2} \cdot I_1 dx1 dx2}{s \cdot e_1} + \frac{\int_{-e_2/2}^{+e_2/2} \int_{-s/2}^{+s/2} \frac{\mu}{2\pi} \cdot \frac{h_2}{(x1-x2+d_2)^2 + h_2^2} \cdot I_2 dx1 dx2}{s \cdot e_2}; \qquad (2)$$

If, for example, the resulting component $B_{12x}$ of the magnetic flux density in the active area 14a of the vertical Hall sensor element 14 is calculated by means of equation 2—the lateral distances or offsets d1 and d2 being maintained in the result as variables—a local maximum value may be calculated, or determined, for the resulting component $B_x$ of the magnetic flux density, for example by means of an algebraic evaluation of the resulting function in dependence on the lateral distances d1 and d2.

Thus, by means of setting the lateral distances d1 and d2 in a targeted manner for the first and second exciting conductors 16-1, 16-2 a resulting further linearization of the curve for the component $B_{12x}$ may be realized in an area wherein the vertical distances $h_1$, $h_2$ are subjected to the process tolerances $\Delta h_1$, $\Delta h_2$.

It should become clear from the above explanations that the exciting conductor arrangement 16 may also comprise more than two exciting conductors (not shown in the figures) whose magnetic fields may be combined so as to obtain further linearization of the detectable component $B_x$ in the active semiconductor area of the Hall sensor element 14. The further exciting conductors are in one or more further exciting conductor planes which are spaced apart, in parallel to the substrate surface (12a), from the vertical Hall sensor element (14) at a vertical distance $h_n$ comprising a tolerance range $\Delta h_n$ which is due to the manufacturing process, and each of them further comprises a lateral distance $d_n$ as an offset from the center position, the lateral distance $d_n$ being dimensioned such that a resulting calibration component $B_{2n}$ of a magnetic flux density created by the exciting conductor arrangement in the vertical Hall sensor element changes by less than 5% within the respective tolerance range $\Delta h_n$ for the respective vertical distance $h_n$.

With regard to the above explanations it shall further be noted that the exciting conductor arrangement may comprise not only integrated conductors and/or exciting conductors, but that the above explanations may similarly be applied to discrete conductor arrangements that are arranged in an offset manner above the active area of the Hall sensor element.

In summary it may thus be stated that by suitably setting a lateral offset of an exciting conductor or of a plurality of exciting conductors in relation to a center position located above (or optionally below) the active area of the Hall sensor element, a resulting curve of the component, detectable by the Hall sensor element, of the magnetic flux density may be obtained, which curve—within the tolerance range for the vertical distances $h_1$ and $h_2$, respectively—is extremely linear and has a (local) maximum value where possible, so that in a calibration process any process tolerances with regard to the vertical distances $h_1$, $h_2$ essentially do not affect the component, created in the active area of the Hall sensor element, of the magnetic flux density.

Figure 5:
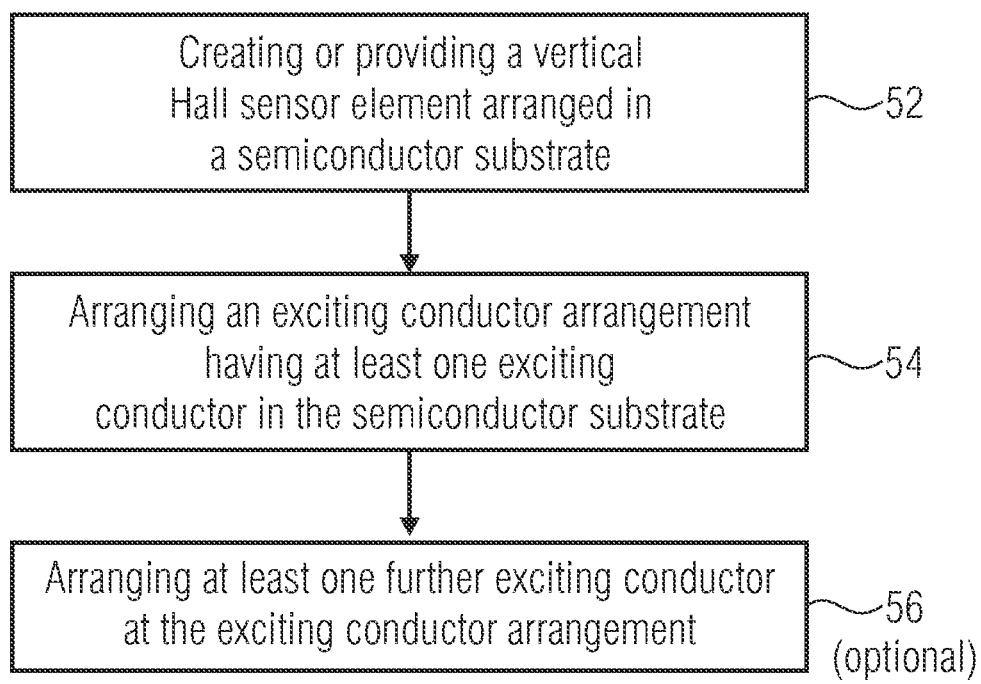
FIG. 5 shows a schematic flowchart of a method of producing a calibratable magnetic field sensor in accordance with a further embodiment of the present invention.
Figure 8:
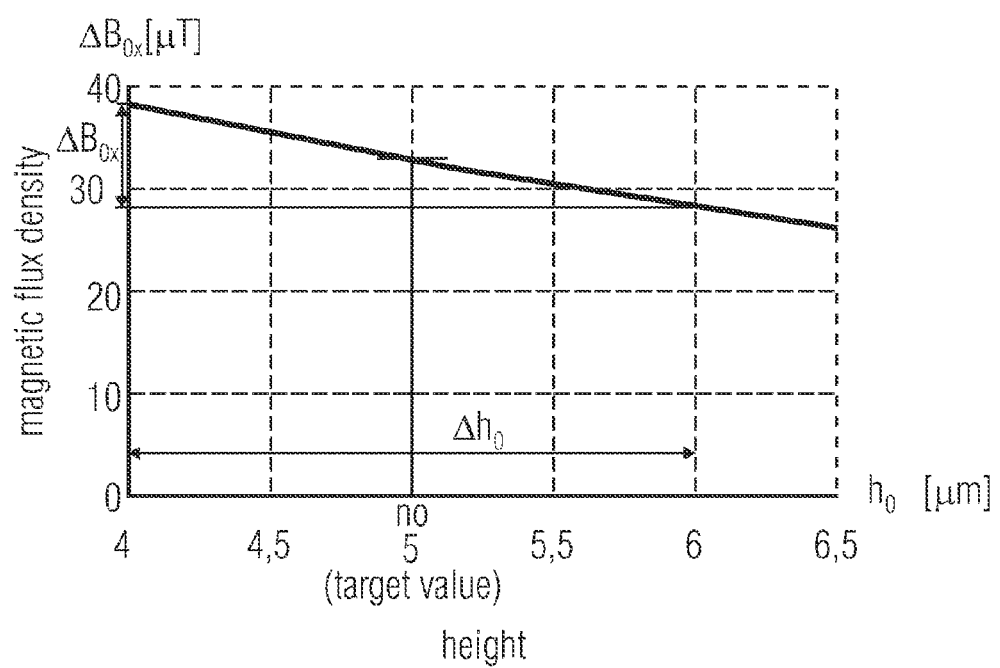
FIG. 8 shows a schematic curve of the magnetic flux density in a magnetic field sensor in dependence on process tolerances in accordance with conventional technology.

An embodiment in the form of a flowchart of a fundamental method 50 of producing a calibratable magnetic field sensor in accordance with the present invention will be described below with reference to FIG. 5.

Initially, step 52 comprises arranging a vertical Hall sensor element in a semiconductor substrate, or providing a vertical Hall sensor element arranged in a semiconductor substrate. Subsequently, step 54 comprises arranging an exciting conductor arrangement, which has at least one exciting conductor, above (or below) the vertical Hall sensor element, the exciting conductor 16-1 being arranged within an exciting conductor plane $E_1$ which is spaced apart, in parallel to the substrate surface 12a, from the vertical Hall sensor element 14 at a vertical distance $h_1$ comprising a tolerance range $\Delta h_1$ which is due to the manufacturing process, and which exciting conductor 16-1 further comprises a lateral distance $d_1$ as an offset from a center position which is located, in relation to the substrate surface 12a, perpendicularly to the vertical Hall sensor element 14, and the lateral distance $d_1$ being dimensioned such that a calibration component $B_1$, of a magnetic flux density $B_1$ created by the exciting conductor arrangement 16 in the vertical Hall sensor element 14 changes by less than 5% within the tolerance range $\Delta h_1$ for the vertical distance $h_1$.

Optionally, a step 56 comprises arranging at least one further exciting conductor 16-2 at the exciting conductor arrangement 16, said further exciting conductor 16-2 being within a further exciting conductor plane $E_1'$ which is arranged to be spaced apart, in parallel to the substrate surface 12a, from the vertical Hall sensor element 14 at a vertical distance $h_2$ comprising a tolerance range $\Delta h_2$ which is due to the manufacturing process, and which exciting conductor 16-1 further comprises a lateral distance $d_2$ as an offset from the center position, and the lateral distance $d_2$ being dimensioned such that a resulting calibration component $B_{2x}$ of a magnetic flux density created by the exciting conductor arrangement in the vertical Hall sensor element changes by less than 5% within the tolerance range $\Delta h_2$ for the vertical distance $h_2$.

In the above description of the inventive calibratable magnetic field sensor and its manufacturing process, the calibratable magnetic field sensor was represented with a vertical Hall sensor element arranged in the semiconductor substrate. However, it should become clear that the calibratable magnetic field sensor may also comprise a plurality of vertical Hall sensor elements and a corresponding exciting conductor arrangement comprising an exciting conductor or a plurality of exciting conductors. The above-described inventive implementation of the exciting conductor arrangement, provided for a calibration process, and its arrangement with regard to a vertical Hall sensor element are also applicable accordingly to the individual vertical Hall sensor elements of such a calibratable magnetic field sensor comprising several individual vertical Hall sensor elements.

Even though some aspects were described in the context of an apparatus, it is understood that said aspects also represent a description of the corresponding method, so that an element of an apparatus or its implementation is also to be understood as a corresponding method step or as a feature of a method step. By analogy therewith, aspects that were described in the context of or as a method step shall also represent a description of a corresponding element, detail or feature of a corresponding apparatus.

In accordance with an embodiment, the magnetic field sensor 10 includes, for example, a vertical Hall sensor element 14, the contacts of which are arranged along the z direction, said Hall sensor element 14 being arranged in a semiconductor substrate 12 which has an x direction and a z direction extending in its surface and which has a y direction extending vertically to its surface, and an exciting conductor arrangement 16 having at least one exciting conductor 16-1. The exciting conductor 16-1 is arranged, e.g., within an exciting conductor plane E1 spaced apart from the vertical Hall sensor element 14 in parallel with the substrate surface 12a at a vertical distance which within a tolerance range Δh1=20% equals a distance h1, and further comprises a lateral distance, in the x direction d1, from the vertical Hall sensor element 14. The lateral distance d1 is dimensioned, e.g., such that a calibration component B1x would change by less than 5% within the tolerance range Δh1 for the vertical distance h1 in the x direction of a magnetic flux density B1 created by the exciting conductor arrangement 16 in the vertical Hall sensor element 14 at a predefined calibration current, the distances being determined on the basis of the geometric center-of-gravity line of the exciting conductor and of the active area of the Hall sensor element, respectively.

The lateral distance d1 is selected, for example, such that the curve of the calibration component B1x adopts a local maximum value at h=h1 in dependence on a vertical distance h at a calibration current intensity I1 of the magnetic flux density which is created by the exciting conductor in the vertical Hall sensor element and is assumed to have the following equation:

$$B_{1x} = \frac{\int_{-e_1/2}^{+e_1/2} \int_{-s/2}^{+s/2} \frac{\mu}{2\pi} \cdot \frac{h_y}{(x1-x2+d_1)^2 + h_y^2} \cdot I_1 dx1 dx2}{s \cdot e_1},$$

wherein the exciting conductor 16-1 comprises a width $e_1$, and the active semiconductor area 14a of the vertical Hall sensor element 14 comprises a width s.

The exciting conductor arrangement 16-1 further comprises a further exciting conductor 16-2, for example, said further exciting conductor 16-2 being within a further exciting conductor plane $E_1'$ which is spaced apart, in parallel to the substrate surface 12a, from the vertical Hall sensor element 14 at a vertical distance, and further comprises a lateral distance $d_2$ from the vertical Hall sensor element in the x direction.

The exciting conductor 16-1 is configured, for example, as an integrated or a discrete conductor pattern, said further exciting conductor 16-2 being configured as an integrated or a discrete conductor pattern.

The exciting conductor arrangement 16 comprises, for example, a plurality of further exciting conductors, said further exciting conductors being within one or more further exciting conductor planes which are spaced apart, in parallel to the substrate surface 12a, from the vertical Hall sensor element 14 at a vertical distance, respectively, and further comprise a lateral distance $d_n$ from the vertical Hall sensor element in the x direction, respectively.

In accordance with an embodiment, a method 50 of producing the above magnetic field sensor 10 comprises the following steps: producing or providing 52 the vertical Hall sensor element 14 arranged in the semiconductor substrate 12; and arranging 54 the exciting conductor arrangement 16 comprising at least the one exciting conductor 16-1.

In accordance with a further embodiment, a method 50 of producing a magnetic field sensor 10 further comprises the following steps: producing or providing 52 a vertical Hall sensor element 14, the contacts of which are arranged along the z direction, said Hall sensor element 14 being arranged in a semiconductor substrate 12 which has an x direction and a z direction extending in its surface and which has a y direction extending vertically to its surface; and arranging 54 an exciting conductor arrangement 16 having at least one exciting conductor 16-1, the exciting conductor 16-1 being arranged within an exciting conductor plane E1 which is, in parallel with the substrate surface 12a, from the vertical Hall sensor element 14 at a vertical distance h1 which is subjected to process tolerances, and further comprises a lateral distance d1, provided in the x direction, from the vertical Hall sensor element 14, the distances being determined on the basis of the geometric center-of-gravity line of the exciting conductor and of the active area of the Hall sensor element, respectively, and the lateral distance d1 being selected such that the curve of a vertical calibration component B1x in the x direction of a magnetic flux density B1 created by the exciting conductor arrangement 16 in the vertical Hall sensor element 14 adopts a local maximum value at h=h1 at a predefined calibration current approximated by the following equation:

$$B_{1x} = \frac{\int_{-e_1/2}^{+e_1/2} \int_{-s/2}^{+s/2} \frac{\mu}{2\pi} \cdot \frac{h_y}{(x1-x2+d_1)^2 + h_y^2} \cdot I_1 x1 dx2}{s \cdot e_1}$$

wherein the exciting conductor 16-1 comprises a width $e_1$, and the active semiconductor area 14a of the vertical Hall sensor element 14 comprises a width s, the distances being determined on the basis of the geometric center-of-gravity line of the exciting conductor and of the active area of the Hall sensor element, respectively.

In accordance with a further embodiment, a method 50 of producing a magnetic field sensor 10 further comprises the following steps: producing or providing 52 a vertical Hall sensor element 14, the contacts of which are arranged along the z direction, said Hall sensor element 14 being arranged in a semiconductor substrate 12 which has an x direction and a z direction extending in its surface and which has a y direction extending vertically to its surface; and arranging 54 an exciting conductor arrangement 16 having at least one exciting conductor 16-1 and one further exciting conductor 16-2, the exciting conductor 16-1 being arranged within an exciting conductor plane $E_1$ which is provided, in parallel with the substrate surface 12a, at a vertical distance $h_1$ from the vertical Hall sensor element 14, which distance $h_1$ is subjected to process tolerances, and further comprises a lateral distance $d_1$ in the x direction from the vertical Hall sensor element 14, and wherein the further exciting conductor 16-2 is provided within a further exciting conductor plane $E_1'$ which is provided, in parallel to the substrate surface 12a, at a vertical distance $h_2$, which is subjected to process tolerances, from the vertical Hall sensor element 14, and further comprises a lateral distance $d_2$ from the Hall sensor element in the x direction, and wherein the lateral distances d1 and d2 are selected such that the curve of a resulting vertical calibration component $B_{2x}$ of a magnetic flux density created by the exciting conductor arrangement in the vertical Hall sensor element adopts a local maximum value at $h=h_1$ and $h'=h_2$ at predefined calibration current densities $I_1$ and $I_2$ through the exciting line and the further exciting line, approximated by the following equation:

$$B_{12x} = \frac{\int_{-e_1/2}^{+e_1/2} \int_{-s/2}^{+s/2} \frac{\mu}{2\pi} \cdot \frac{h_1}{(x1-x2+d_1)^2 + h^2} \cdot I_1 dx1 dx2}{s \cdot e_1} +$$

$$\frac{\int_{-e_2/2}^{+e_2/2} \int_{-s/2}^{+s/2} \frac{\mu}{2\pi} \cdot \frac{h'}{(x1-x2+d_2)^2 + h'^2} \cdot I_2 dx1 dx2}{s \cdot e_2};$$

wherein the exciting conductor 16-1 comprises a width $e_1$ and the further exciting conductor 16-2 comprises a width $e_2$, and the active area 14a of the vertical Hall sensor element 14 comprises a width s, the distances being determined on the basis of the geometric center-of-gravity lines of the exciting conductor and of the active area of the Hall sensor element, respectively.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A magnetic field sensor comprising:
a vertical Hall sensor element arranged in a semiconductor substrate; and
an exciting conductor arrangement comprising at least one exciting conductor;
said exciting conductor being arranged within an exciting conductor plane which is spaced apart, in parallel to the substrate surface, from the vertical Hall sensor element at a vertical distance $h_1$ comprising a tolerance range $\Delta h_1$ which is due to the manufacturing process, and further comprises a lateral distance $d_1$ as an offset from a center position which is located, in relation to the substrate surface, perpendicularly to the vertical Hall sensor element, and
said lateral distance $d_1$ being dimensioned such that a vertical calibration component $B_{1x}$ of a magnetic flux density $B_1$ created by the exciting conductor arrangement in the vertical Hall sensor element changes by less than 5% within the tolerance range $\Delta h_1$ for the vertical distance $h_1$.

2. The magnetic field sensor as claimed in claim 1, wherein the vertical calibration component may be represented by the following equation with a calibration current intensity $I_1$ of the magnetic flux density created by the exciting conductor in the vertical Hall sensor element:

$$B_{1x} = \frac{\int_{-e_1/2}^{+e_1/2} \int_{-s/2}^{+s/2} \frac{\mu}{2\pi} \cdot \frac{h_1}{(x1-x2+d_1)^2 + h_1^2} \cdot I_1 dx1 dx2}{s \cdot e_1}$$

wherein the exciting conductor comprises a width $e_1$, and the active semiconductor area of the vertical Hall sensor element comprises a width s.

3. The magnetic field sensor as claimed in claim 1, wherein the exciting conductor arrangement comprises a further exciting conductor, said further exciting conductor being within a further exciting conductor plane which is spaced apart, in parallel to the substrate surface, from the vertical Hall sensor element at a vertical distance $h_2$ comprising a tolerance range $\Delta h_2$ which is due to the manufacturing process, and which exciting conductor further comprises a lateral distance $d_2$ as an offset from the center position, and the lateral distance $d_2$ being dimensioned such that a resulting vertical calibration component $B_{2x}$ of a magnetic flux density created by the exciting conductor arrangement in the vertical Hall sensor element changes by less than 5% within the tolerance range $\Delta h_2$ for the vertical distance $h_2$.

4. The magnetic field sensor as claimed in claim 3, wherein the resulting vertical calibration component $B_{12x}$ of a magnetic flux density $B_{12x}$ created by the exciting conductor arrangement in the vertical Hall sensor element is based on a combination of the vertical calibration components $B_{x1}$ and $B_{x2}$ created by the exciting conductor and the further exciting conductor, respectively.

5. The magnetic field sensor as claimed in claim 3, wherein the resulting vertical calibration component $B_{12x}$ of the magnetic flux density created by the exciting conductor arrangement in the vertical Hall sensor element may be represented by the following equation:

$$B_{12x} = \frac{\int_{-e_1/2}^{+e_1/2} \int_{-s/2}^{+s/2} \frac{\mu}{2\pi} \cdot \frac{h_1}{(x1-x2+d_1)^2 + h_1^2} \cdot I_1 dx1 dx2}{s \cdot e_1} +$$

$$\frac{\int_{-e_2/2}^{+e_2/2} \int_{-s/2}^{+s/2} \frac{\mu}{2\pi} \cdot \frac{h_2}{(x1-x2+d_2)^2 + h_2^2} \cdot I_2 dx1 dx2}{s \cdot e_2};$$

wherein the exciting conductor is arranged in a conductor width and the further exciting conductor is arranged within a further conductor plane, and wherein the further exciting conductor comprises a width $e_2$, and the active area of the vertical Hall sensor element comprises a width s.

6. The magnetic field sensor as claimed in claim 1, wherein the exciting conductor is configured as an integrated or a discrete conductor pattern, and wherein the further exciting conductor is configured as an integrated or a discrete conductor pattern.

7. The magnetic field sensor as claimed in claim 1, wherein the exciting conductor arrangement comprises a plurality of further exciting conductors, said further exciting conductors being in one or more further exciting conductor planes which are spaced apart, in parallel to the substrate surface, from the vertical Hall sensor element at a vertical distance $h_n$ comprising a tolerance range $\Delta h_n$ which is due to the manufacturing process, and each of them further comprises a lateral distance $d_n$ as an offset from the center position, the lateral distance $d_n$ being dimensioned such that a resulting vertical calibration component $B_{2n}$ of a magnetic flux density created by the exciting conductor arrangement in the vertical Hall sensor element changes by less than 5% within the respective tolerance range $\Delta h_n$ for the respective vertical distance $h_n$.

8. A method of producing a magnetic field sensor, comprising:
producing or providing a vertical Hall sensor element arranged in a semiconductor substrate; and
arranging an exciting conductor arrangement comprising at least one exciting conductor,
the exciting conductor being arranged within an exciting conductor plane which is spaced apart, in parallel to the substrate surface, from the vertical Hall sensor element at a vertical distance $h_1$ comprising a tolerance range $\Delta h_1$ which is due to the manufacturing process, and which exciting conductor further comprises a lateral distance $d_1$ as an offset from a center position which is located, in relation to the substrate surface, perpendicularly to the vertical Hall sensor element, and the lateral distance $d_1$ being dimensioned such that a vertical calibration component $B_{1x}$ of a magnetic flux density $B_1$ created by the exciting conductor arrangement in the vertical Hall sensor element changes by less than 5% within the tolerance range $\Delta h_1$ for the vertical distance $h_1$.

9. The method as claimed in claim 8, further comprising:

arranging at least one further exciting conductor at the exciting conductor arrangement, said further exciting conductor being within a further exciting conductor plane which is arranged to be spaced apart, in parallel to the substrate surface, from the vertical Hall sensor element at a vertical distance $h_2$ comprising a tolerance range $\Delta h_2$ which is due to the manufacturing process, and which exciting conductor further comprises a lateral distance $d_2$ as an offset from the center position, and the lateral distance $d_2$ being dimensioned such that a resulting vertical calibration component $B_{2x}$ of a magnetic flux density created by the exciting conductor arrangement in the vertical Hall sensor element changes by less than 5% within the tolerance range $\Delta h_2$ for the vertical distance $h_2$.

10. The method as claimed in claim 8, further comprising:

arranging a plurality of further exciting conductors at the exciting conductor arrangement, said further exciting conductors being in one or more further exciting conductor planes which are spaced apart, in parallel to the substrate surface, from the vertical Hall sensor element at a vertical distance $h_n$ comprising a tolerance range $\Delta h_n$ which is due to the manufacturing process, and each of them further comprises a lateral distance $d_n$ as an offset from the center position, the lateral distance $d_n$ being dimensioned such that a resulting vertical calibration component $B_{2n}$ of a magnetic flux density created by the exciting conductor arrangement in the vertical Hall sensor element changes by less than 5% within the respective tolerance range $\Delta h_n$ for the respective vertical distance $h_n$.

\* \* \* \* \*